United States Patent
Park et al.

(10) Patent No.: US 10,636,666 B1
(45) Date of Patent: Apr. 28, 2020

(54) ETCHANT AND METHOD FOR MANUFACTURING DISPLAY DEVICE USING THE SAME

(71) Applicants: SAMSUNG DISPLAY CO., LTD., Yongin-si, Gyeonggi-do (KR); DONGWOO FINE-CHEM CO., LTD., Iksan-si, Jeollabuk-do (KR)

(72) Inventors: Jong Hee Park, Yongin-si (KR); Gi Yong Nam, Hwaseong-si (KR); Jin Seock Kim, Seongnam-si (KR); Ki Tae Kim, Osan-si (KR); Won Ho Lee, Seoul (KR); Young-Jin Yoon, Jeonju-si (KR); Young-Chul Park, Iksan-si (KR)

(73) Assignees: SAMSUNG DISPLAY CO., LTD., Yongin-si, Gyeonggi-Do (KR); DONGWOO FINE-CHEM CO., LTD., Iksan-si, Jeollabuk-Do (KR)

( * ) Notice: Subject to any disclaimer, the term of this patent is extended or adjusted under 35 U.S.C. 154(b) by 0 days.

(21) Appl. No.: 16/598,475

(22) Filed: Oct. 10, 2019

(30) Foreign Application Priority Data

Oct. 11, 2018 (KR) ........................ 10-2018-0121118

(51) Int. Cl.
| | | |
|---|---|---|
| *H01L 21/306* | (2006.01) | |
| *C09K 13/06* | (2006.01) | |
| *H01L 27/32* | (2006.01) | |
| *H01L 51/56* | (2006.01) | |
| *H01L 33/00* | (2010.01) | |

(Continued)

(52) U.S. Cl.
CPC ........ *H01L 21/30604* (2013.01); *C09K 13/06* (2013.01); *C23F 1/00* (2013.01); *C23F 1/10* (2013.01); *C23F 1/16* (2013.01); *C23F 1/30* (2013.01); *C23F 1/44* (2013.01); *H01L 21/28* (2013.01); *H01L 21/302* (2013.01); *H01L 21/306* (2013.01); *H01L 27/156* (2013.01); *H01L 27/3246* (2013.01); *H01L 33/005* (2013.01); *H01L 51/56* (2013.01); *H01L 27/323* (2013.01)

(58) Field of Classification Search
CPC ......... H01L 21/02019; H01L 21/02296; H01L 21/02343; H01L 21/28; H01L 21/302; H01L 21/306; H01L 21/30604; H01L 21/3213; H01L 21/32134; H01L 21/1888; C23F 1/00; C23F 1/10; C23F 1/16; C23F 1/30; C23F 1/44

See application file for complete search history.

(56) References Cited

U.S. PATENT DOCUMENTS

| | | | |
|---|---|---|---|
| 7,141,180 B2 | 11/2006 | Park et al. | |
| 7,357,878 B2 | 4/2008 | Park et al. | |

(Continued)

FOREIGN PATENT DOCUMENTS

| | | | |
|---|---|---|---|
| JP | 4756069 B2 | 8/2011 | |
| JP | 5158339 B2 | 3/2013 | |

(Continued)

*Primary Examiner* — Eduardo A Rodela
(74) *Attorney, Agent, or Firm* — Kile Park Reed & Houtteman PLLC (57) ABSTRACT

An etchant includes about 8 wt % to about 12 wt % of nitric acid, about 3 wt % to about 8 wt % of alkylsulfonic acid, about 7 wt % to about 12 wt % of a sulfate, about 40 wt % to about 55 wt % of an organic acid, about 0.5 wt % to about 5 wt % of an organic acid salt, and a balance of water.

20 Claims, 8 Drawing Sheets

(51) Int. Cl.
    *H01L 27/15*    (2006.01)
    *C23F 1/16*     (2006.01)
    *C23F 1/00*     (2006.01)
    *C23F 1/30*     (2006.01)
    *H01L 21/302*   (2006.01)
    *H01L 21/28*    (2006.01)
    *C23F 1/10*     (2006.01)
    *C23F 1/44*     (2006.01)

(56) References Cited

U.S. PATENT DOCUMENTS

| | | |
|---|---|---|
| 8,455,310 B2 | 6/2013 | Yim |
| 8,785,224 B2 | 7/2014 | Ko et al. |
| 2008/0277381 A1 | 11/2008 | Chung et al. |
| 2016/0348001 A1 | 12/2016 | Shigeta et al. |
| 2017/0029958 A1* | 2/2017 | An .................. C23F 1/18 |

FOREIGN PATENT DOCUMENTS

| | | |
|---|---|---|
| KR | 10-0712879 B1 | 4/2007 |
| KR | 10-0853216 B1 | 8/2008 |
| KR | 10-0993775 B1 | 11/2010 |
| KR | 10-2014-0063283 A | 5/2014 |
| KR | 10-2014-0063284 A | 5/2014 |
| KR | 10-1391603 B1 | 5/2014 |
| KR | 10-1459502 B1 | 11/2014 |
| KR | 10-1518055 B1 | 5/2015 |
| KR | 10-1537207 B1 | 7/2015 |
| KR | 10-2016-0100591 A | 8/2016 |
| KR | 10-2016-0107761 A | 9/2016 |
| KR | 10-2016-0122715 A | 10/2016 |
| KR | 10-1695608 B1 | 1/2017 |
| KR | 10-2017-0136403 A | 12/2017 |
| KR | 10-1905195 B1 | 10/2018 |
| WO | WO 2006/107176 A1 | 10/2006 |
| WO | WO 2013/009505 A2 | 1/2013 |

* cited by examiner

ETCHANT AND METHOD FOR MANUFACTURING DISPLAY DEVICE USING THE SAME

CROSS-REFERENCE TO RELATED APPLICATION

Korean Patent Application No. 10-2018-0121118 filed on Oct. 11, 2018, in the Korean Intellectual Property Office, and entitled: "Etchant and Method for Manufacturing Display Device Using the Same," is incorporated by reference herein in its entirety.

BACKGROUND

1. Field

This disclosure relates to an etchant and a method of manufacturing a display device using the same.

2. Description of the Related Art

A light emitting display includes two electrodes and a light emitting layer disposed therebetween. Electrons injected from one electrode and holes injected from the other electrode are combined in the light emitting layer to form an exciton, and the exciton emits light while emitting energy. Using this light emission, the light emitting display device displays a predetermined image.

The light emitting display includes a plurality of pixels including a light emitting diode that is a photoluminescent device. The light emitting diode includes an anode, a light emitting layer, and a cathode. Herein, the anode includes silver (Ag) to have characteristics of low resistance and high reflectivity.

SUMMARY

Embodiments are directed to an etchant, including about 8 wt % to about 12 wt % of nitric acid, about 3 wt % to about 8 wt % of alkylsulfonic acid, about 7 wt % to about 12 wt % of a sulfate, about 40 wt % to about 55 wt % of an organic acid, about 0.5 wt % to about 5 wt % of an organic acid salt, and a balance of water.

A ratio of the sulfate relative to the organic acid salt by weight may be about 4 to about 6.

The alkylsulfonic acid may include at least one of methane sulfonic acid, ethane sulfonic acid, and propane sulfonic acid.

The alkylsulfonic acid may be methane sulfonic acid.

The organic acid may include at least one of acetic acid, citric acid, glycolic acid, malonic acid, lactic acid, and tartaric acid.

The organic acid may include the acetic acid and the citric acid.

The organic acid salt may include at least one of an acetate salt, a citrate salt, a glycolate salt, a malonate salt, a lactate salt, and a tartrate salt.

The organic acid salt may include the acetate salt or the citrate salt.

The sulfate may include at least one of potassium bisulfate, sodium bisulfate, and magnesium sulfate.

Embodiments are also directed to a method of manufacturing a display device including forming a transistor and a pad on a substrate, forming a planarization layer on the transistor, forming a first electrode material layer on the planarization layer and the pad, etching the first electrode material layer using an etchant to form a first electrode connected to the transistor, forming a pixel defining layer having an opening overlapping with the first electrode on the first electrode, forming a light emitting member on the first electrode in the opening, and forming a second electrode on the light emitting member, wherein the etchant comprises about 8 wt % to about 12 wt % of nitric acid, about 3 wt % to about 8 wt % of alkylsulfonic acid, about 7 wt % to about 12 wt % of a sulfate, about 40 wt % to about 55 wt % of an organic acid, about 0.5 wt % to about 5 wt % of an organic acid salt, and a balance of water.

The first electrode material layer may include a lower electrode material layer including a transparent conductive material, a middle electrode material layer on the lower electrode material layer, the middle electrode material layer including silver or a silver alloy material, and an upper electrode material layer on the middle electrode material layer, the upper electrode material layer including the transparent conductive material.

In forming the first electrode, the etchant may batch-etch the lower electrode material layer, the middle electrode material layer, and the upper electrode material layer.

A ratio of the sulfate relative to the organic acid salt by weight may be about 4 to about 6.

The alkylsulfonic acid includes at least one of methane sulfonic acid, ethane sulfonic acid, and propane sulfonic acid.

The alkylsulfonic acid may be the methane sulfonic acid.

The organic acid may include at least one of acetic acid, citric acid, glycolic acid, malonic acid, lactic acid, and tartaric acid.

The organic acid may include the acetic acid and the citric acid.

The organic acid salt may include at least one of an acetate salt, a citrate salt, a glycolate salt, a malonate salt, a lactate salt, and a tartrate salt.

The organic acid salt may include the acetate salt or the citrate salt.

The sulfate may include at least one of potassium bisulfate, sodium bisulfate, and magnesium sulfate.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, an etchant according to an embodiment is described.

The etchant according to the present embodiment may be for batch-etching a multilayered metal layer composed of a metal layer including a transparent conductive material and a metal layer including silver (Ag) or a silver alloy. For example, the etchant according to the present embodiment may be for batch-etching an electrode layer composed of a triple layer of a first metal layer including a transparent conductive material, a second metal layer on the first metal layer, the second metal layer including silver (Ag) or a silver alloy, and a third metal layer on the second metal layer, the third metal layer including an electrode layer. In some implementations, the etchant according to the present embodiment may be for batch-etching an electrode layer composed of a double layer of a second metal layer on a first metal layer, the first metal layer including a transparent conductive material and the second metal layer including silver (Ag) or a silver alloy.

The transparent conductive material may include one of indium-tin-oxide (ITO), indium-zinc-oxide (IZO), indium-tin-zinc-oxide (ITZO), and indium-gallium-zinc-oxide (IGZO). The silver alloy i may include silver as a main component and may further include a metal such as neodymium (Nd), copper (Cu), palladium (Pd), niobium (Nb), nickel (Ni), molybdenum (Mo), chromium (Cr), magnesium (W), protactinium (Pa), titanium (Ti), or the like, an alloy including other metals, a nitride of silver, a silicide of silver, a carbide of silver, or an oxide of silver.

The etchant according to the present embodiment may include nitric acid, alkylsulfonic acid, organic acid, an organic acid salt, sulfate, and a balance amount of water.

The nitric acid is an oxidizing agent. The nitric acid may serve to oxidize a metal layer including silver or a silver alloy and a metal layer including a transparent conductive material. The nitric acid may be included in an amount of about 8 wt % to about 12 wt % based on the total amount of the etchant. When the nitric acid is included in the range of about 8 wt % to about 12 wt % based on the total amount of the etchant, it may be easy to control an etch-rate of the metal layer including the silver or silver alloy and the metal layer including the transparent conductive material. The metal layer including the transparent conductive material may be uniformly etched.

The alkylsulfonic acid is an etchant that acts to etch a metal layer including silver or a silver alloy and a metal layer including a transparent conductive material, which are oxidized by nitric acid. As the alkylsulfonic acid, at least one of methane sulfonic acid, ethane sulfonic acid, and propane sulfonic acid may be used. For example, methane sulfonic acid may be desirably used.

The alkylsulfonic acid may be included in an amount of about 3 wt % to about 8 wt % based on the total amount of the etchant. When the alkylsulfonic acid is included in the range of 3 wt % to 8 wt % by weight based on the total amount of the etchant, it may be easy to control the etch-rate of the metal layer including the silver or silver alloy and the metal layer including the transparent conductive material. Defects caused by silver residues and silver readsorption may be minimized or prevented.

The organic acid may act as an etchant to etch the metal layer including the silver or silver alloy oxidized by nitric acid. The organic acid may include at least one material of acetic acid, citric acid, glycolic acid, malonic acid, lactic acid, and tartaric acid. For example, the organic acid may include at least two materials of acetic acid, citric acid, glycolic acid, malonic acid, lactic acid, and tartaric acid. For example, acetic acid and citric acid may be used.

The organic acid may be included in an amount of about 40 wt % to about 55 wt % based on the total amount of the etchant. When the organic acid is included in the range of about 40 wt % to about 55 wt % based on the total amount of the etchant, an etch-rate of the metal layer including the silver or silver alloy may be easily controlled and defects due to the formation of silver residues and silver readsorption may be minimized or prevented.

The organic acid salt may act as an etchant to etch the metal layer including the silver or silver alloy oxidized by nitric acid. The organic acid salt may include at least one of an acetate salt, a citrate salt, a glycolate salt, a malonate salt, a lactate salt, and a tartrate salt. For example, the organic acid salt may be a citrate salt or an acetate salt.

The organic acid salt may be included in an amount of about 0.5 to about 5 wt % based on the total amount of the etchant. When the organic acid salt is included in the range of about 0.5 to about 5 wt % based on the total amount of the etchant, etch rate control of the metal layer including the silver or silver alloy may be maintained even in continuous use of the etchant, and defects due to the generation of silver residues and silver readsorption may be minimized or prevented.

The sulfate may act as an etchant to etch the metal layer including the transparent conductive material oxidized by nitric acid. In addition, the sulfate may cause an etch stop phenomenon on the metal layer including the silver or silver alloy, thereby preventing an increase in a side etch even when etching time is increased in an etching process (the side etch will be described in the performance evaluation of the etchant). For example, the inclusion of a sulfate in the etchant may cause the etch stop phenomenon, thereby controlling the etch rate and controlling the side etch.

The sulfate may be included in an amount of about 7 wt % to about 12 wt % based on the total amount of the etchant. When the sulfate is included in the range of about 7 wt % to about 12 wt % based on the total amount of the etchant, the etch-rate may be easily controlled, the etch stop phenomenon may be regularly exhibited, and the metal layer including the silver or silver alloy and the metal layer including the transparent conductive material may be uniformly etched. The sulfate may include at least one of potassium bisulfate, sodium bisulfate, and magnesium sulfate.

In the composition of the etchant according to the present embodiment, a ratio by weight of the sulfate relative to the organic acid salt may be about 4 to about 6. If the ratio of the sulfate relative to the organic acid salt is outside the range of about 4 to about 6, the performance of the etchant may be decreased.

The water may be deionized water and may be water for semiconductor processing. In an embodiment, the water may be desirably water of 18 MΩ/cm or greater. The water may be included in a balance amount based on the total amount of the etchant so that the total weight of the etchant may be 100 wt %.

By using the etchant according to the present embodiment, a multilayered metal layer composed of a metal layer including a transparent conductive material and a metal layer including the silver (Ag) or silver alloy may be batch-etched effectively.

The etchant according to the present embodiment may be used not only for the manufacture of displays but also for the manufacture of memory semiconductor display panels, or the like. In addition, the etchant according to the present embodiment may be used for manufacturing other electronic devices including a multilayered metal layer composed of a metal layer including a transparent conductive material and a metal layer including silver (Ag) or a silver alloy.

Hereinafter, a method of manufacturing a display device using the etchant in the above-described embodiment will be described.

Figure 1:
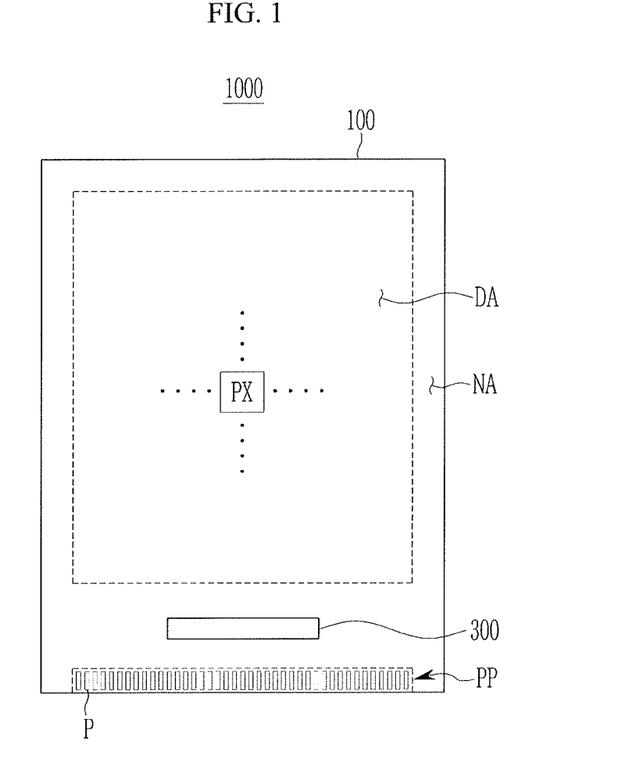
FIG. 1 illustrates a schematic view of an example of a display device according to an embodiment.

FIG. 1 illustrates a schematic view of an example of a display device according to an embodiment.

Referring to FIG. 1, a display device 1000 according to the present embodiment may include a substrate 100 including a display area (DA) and a non-display area (NA) disposed outside the display area (DA).

The substrate 100 may include glass or a plastic. In some implementations, the substrate 100 may be a flexible substrate including a material having improved heat resistance and durability, such as polyethylene naphthalate (PEN), polycarbonate (PC), polyarylate (PAR), polyether imide (PEI), polyether sulfone (PES), or polyimide (PI). The substrate 100 may also be a flexible substrate made of flexible materials.

In the display area (DA), elements for displaying images may be disposed to display images. The non-display area (NA) does not display images. The non-display area (NA) may include elements and/or wires for generating and/or transmitting various signals to be applied to the display area (DA). In FIG. 1, only one side edge region, for example, a lower side region of the substrate 100 is shown as a non-display region (NA). In some implementations, other side edge regions such as left and right side edge regions and/or an upper side region may correspond to the non-display area (NDA). Although the display area (DA) is shown as a quadrangle, in some implementations, the display area (DA) may have other shapes, such as a circle, an ellipse, or a polygon.

I, A plurality of pixels (PX) may be disposed in the display area (DA) of the substrate 100. The plurality of pixels may be, for example, in a matrix form. Signal lines such as a plurality of gate lines, a plurality of data lines, and a plurality of driving voltage lines may be disposed in the display area (DA). The gate lines may extend substantially in a row direction, and the data lines may extend in a substantially column direction intersecting the row direction. The driving voltage lines may substantially extend in a column direction. Each pixel (PX) may be connected to the gate line and the data line. A gate signal and a data signal may be received from the gate line and the data line, respectively. In addition, each pixel (PX) may be connected to a driving voltage line to receive a driving voltage.

In the non-display area (NA) of the substrate 100, a driver 300 for generating and/or processing various signals for driving a display device and a pad portion (PP) including pads for receiving signals from the outside may be disposed.

The driver 300 may include a data driver for applying a data signal to the data line, a gate driver for applying a gate signal to the gate line, and a signal controller for controlling the data driver and the gate driver. The driver 300 may be mounted in a chip form between the display area (DA) and the pad portion (PP). The gate driver may be integrated in the non-display area (NA) of the left/right edge of the substrate 100.

One end of the flexible printed circuit film may be bonded to the pad portion (PP). The other end of the flexible printed circuit film may be connected to an external flexible printed circuit (FPC) board, for example, to receive signals such as image data, and to receive a power supply voltage such as a driving voltage (ELVDD) and a common voltage.

A structure of the pixel of the display device according to FIG. 1 will now be described with reference to FIG. 2.

Several layers, interconnects, and elements are included in the substrate 100. Although a large number of pixels are arranged in the display area (DA) of the substrate 100, only one pixel is shown in FIG. 2 in order to avoid complication of the drawing. Each pixel includes a plurality of transistors, but one transistor will be mainly described.

Figure 2:
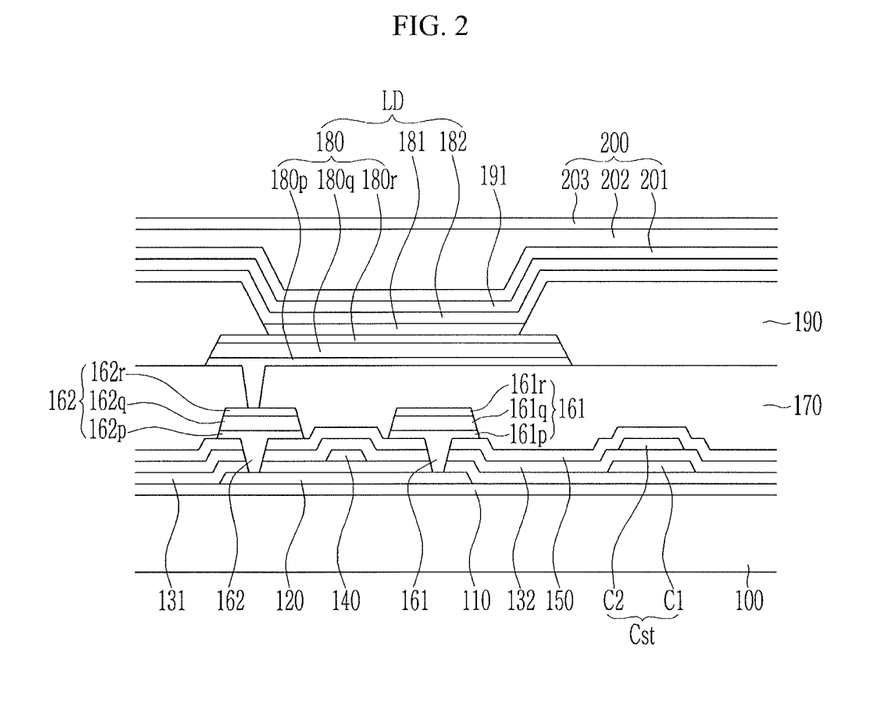
FIG. 2 illustrates a schematic view showing an example of a cross-section of one pixel of the display device according to FIG. 1.

FIG. 2 illustrates a schematic view showing an example of a cross-section of one pixel of the display device according to FIG. 1.

Referring to FIG. 2, a buffer layer 110 may be disposed on the substrate 100. The buffer layer 110 may be formed of a single layer of a silicon nitride (SiNx) or may be a double-layer structure in which a silicon nitride (SiNx) and a silicon oxide (SiOx) are stacked. The buffer layer 110 may serve to prevent or minimize the penetration of undesirable components such as impurities or moisture, and at the same time to planarize the surface. The buffer layer 110 may be omitted depending on a type of the substrate 100 and the process conditions.

A semiconductor layer 120 may be disposed on the buffer layer 110. The semiconductor layer 120 may include a channel region, and a source region and a drain region disposed on both sides of the channel region and doped with impurities. The semiconductor layer 120 may include polysilicon, an oxide semiconductor, or the like.

A gate insulating layer 131 may be disposed on the semiconductor layer 120 and the buffer layer 110. A gate electrode 140 and a first capacitor electrode C1 may be disposed on the gate insulating layer 131 and spaced from each other. The gate electrode 140 and the first capacitor electrode C1 may include the same materials. The gate electrode 140 may overlap with the semiconductor layer 120 in a stacking direction. The gate electrode 140 may overlap with the channel region of the semiconductor layer 120 in the stacking direction.

A capacitor insulating layer 132 may be disposed on the gate electrode 140, the first capacitor electrode C1, and the gate insulating layer 131. The gate insulating layer 131 and the capacitor insulating layer 132 may include an inorganic insulating material such as a silicon nitride and a silicon oxide, respectively.

A second capacitor electrode C2 may be disposed on the capacitor insulating layer 132. The second capacitor electrode C2 may overlap with the first capacitor electrode C1. The capacitor insulating layer 132 disposed between the second capacitor electrode C2 and the first capacitor electrode C1 may be used as a dielectric to provide a storage capacitor Cst.

An interlayer insulating layer 150 may be disposed on the second capacitor electrode C2 and the capacitor insulating layer 132. The interlayer insulating layer 150 may include an inorganic insulating material such as a silicon nitride and a silicon oxide.

A source electrode 161 and a drain electrode 162, which are spaced apart from each other, may be disposed on the interlayer insulating layer 150. The source electrode 161 and the drain electrode 162 may be connected to the semiconductor layer 120 through contact holes disposed in the gate insulating layer 131, the capacitor insulating layer 132, and the interlayer insulating layer 150, respectively. A portion of the semiconductor layer 120 connected to the source electrode 161 and a portion of the semiconductor layer 120 connected to the drain electrode 162 may be respectively a source region and a drain region. The source electrode 161 and the drain electrode 162 may have a triple-layer structure where lower layers 161p and 162p including titanium (Ti) or molybdenum (Mo), intermediate layers 161q and 162q including aluminum (Al), and upper layers 161r and 162r including titanium or molybdenum are sequentially stacked.

The gate electrode 140, the source electrode 161, and the drain electrode 162 may form a transistor together with the semiconductor layer 120. A channel of the transistor may be formed in the channel region of the semiconductor layer 120 overlapping with the gate electrode 140. The illustrated transistor may be a driving transistor in a pixel of a display device. The illustrated transistor may be a top-gate transistor having the gate electrode 140 disposed on the semiconductor layer 120. The structure of the transistor may be variously changed. In some implementations, the gate electrode may be a bottom-gate transistor disposed below the semiconductor.

A planarization layer 170 may be disposed on the source electrode 161, the drain electrode 162, and the interlayer insulating layer 150. The planarization layer 170 may include an organic material. The top surface thereof may be planarized.

A light emitting diode (LD) and a pixel defining layer 190 may be disposed on the planarization layer 170. The light emitting diode (LD) may emit light according to a signal received from the transistor. The light emitting diode (LD) may include a first electrode 180, a light emitting member 181, and a second electrode 182.

The first electrode 180 may be disposed on the planarization layer 170. The first electrode may be electrically connected to the drain electrode 162 through a contact hole formed in the planarization layer 170. The first electrode 180 may be an anode of the light emitting diode (LD).

The first electrode 180 may have a triple-layer structure in which a lower electrode 180p, a middle electrode 180q, and an upper electrode 180r are sequentially stacked. The lower electrode 180p and the upper electrode 180r may include a transparent conductive material. ahe middle electrode 180q may include silver or a silver alloy.

The transparent conductive material may include one of indium-tin-oxide (ITO), indium-zinc-oxide (IZO), indium-tin-zinc-oxide (ITZO), and indium-gallium-zinc-oxide (IGZO). The silver alloy may include silver as a main component, and may further include a metal such as neodymium (Nd), copper (Cu), palladium (Pd), niobium (Nb), nickel (Ni), molybdenum (Mo), chromium (Cr), magnesium (W), protactinium (Pa), titanium (Ti), or the like, an alloy including other metals, a nitride of silver, a silicide of silver, a carbide of silver, or an oxide of silver.

The pixel defining layer 190 may be disposed on the planarization layer 170. The pixel defining layer 190 may have an opening overlapping with the first electrode 180. The pixel defining layer 190 may include an organic material.

The light emitting member 181 may be disposed on the first electrode 180 overlapping with an opening of the pixel defining layer 190. The light emitting member 181 may include at least one of a light emitting layer, a hole-injection layer (HIL), a hole-transporting layer (HTL), an electron-transporting layer (ETL), and an electron-injection layer. When the light emitting member 181 includes all of these layers, the hole-injection layer may be disposed on the first electrode 180, which may be an anode, and a hole-transporting layer, a light emitting layer, an electron-transporting layer, and an electron-injection layer may be sequentially stacked thereon. The light emitting layer may include an organic material or an inorganic material.

The second electrode 182 may be disposed on the pixel defining layer 190 and the light emitting member 181. The second electrode 182 may include a transparent conductive material. The second electrode 182 may serve as a cathode of the light emitting diode (LD).

A capping layer 191 may be disposed on the second electrode 182. The capping layer 191 helps to efficiently emit light generated in the light emitting member 181 toward the outside.

An encapsulation layer 200 may be disposed on the capping layer 191. The encapsulation layer 200 may seal the light emitting diode (LD) and prevent moisture or oxygen from penetrating from the outside. Such an encapsulation layer 200 includes a first inorganic layer 201, an organic layer 202, and a second inorganic layer 203. The first inorganic layer 201 may be disposed on the capping layer 191 and may include an inorganic material. The organic layer 202 may be disposed on the first inorganic layer 201 and may include an organic material. The upper surface of the organic layer 202 may be planarized. The second inorganic layer 203 may be disposed on the organic layer 202 and may include an inorganic material. The encapsulation layer 200 may further include at least one organic layer and at least one inorganic layer sequentially disposed on the second inorganic layer 203. For example, the organic layer and the inorganic layer may be alternately disposed.

A touch sensing layer may be disposed on the encapsulation layer 200. The touch sensing layer may sense a touch when an object approaches the touch sensing layer or contacts the touch sensing layer. The contact may include not only when an external object such as a user's hand touches the touch sensing layer directly, but also when an external object approaches the touch sensing layer or is hovering while approaching the touch sensing layer.

Hereinafter, the pad portion of the display device according to FIG. 1 will be described with reference to FIGS. 3 and 4.

Figure 3:
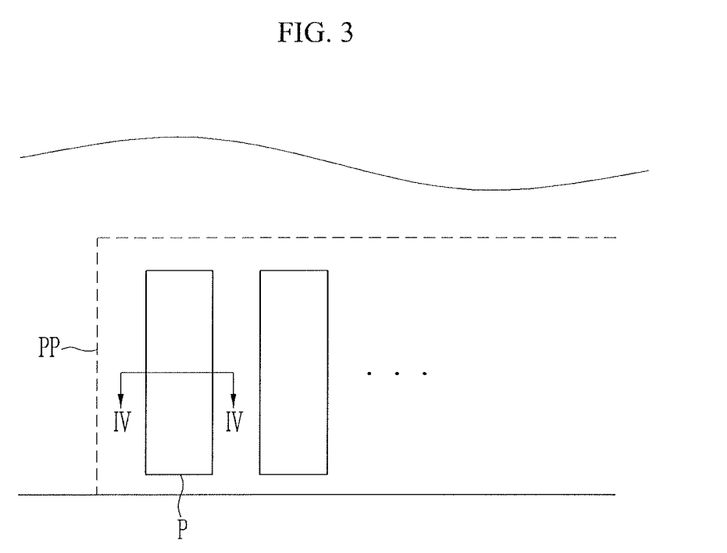
FIG. 3 illustrates a schematic view showing an example of a pad portion of the display device according to FIG. 1.

FIG. 3 illustrates a schematic view showing an example of a pad portion of the display device according to FIG. 1. FIG. 4 illustrates a schematic view showing an example of a cross-section taken along the line IV-IV of FIG. 3.

Figure 4:
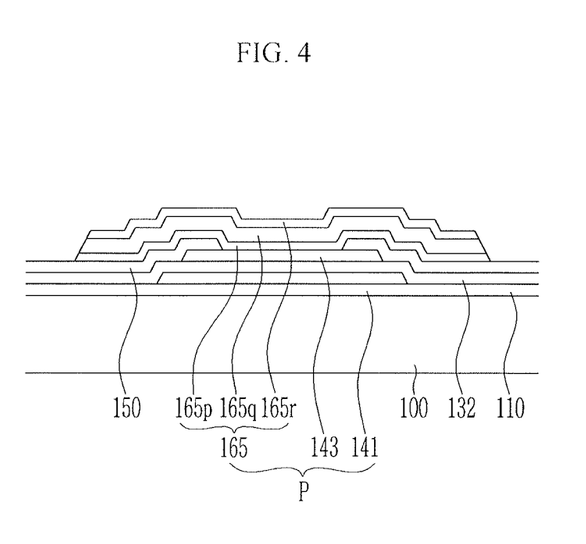
FIG. 4 illustrates a schematic view showing an example of a cross-section taken along the line IV-IV of FIG. 3.

Referring to FIGS. 3 and 4, a plurality of pads P may be spaced apart from each other by a predetermined distance in the pad portion (PP). Each pad P may have a substantially quadrangular planar shape and may extend in a direction perpendicular to the edge of the substrate 100 on which the pad portion (PP) is disposed. In some implementations, each pad P may extend in an inclined direction with respect to the edge of the substrate 100 on which the pad portion PP is disposed.

Each pad P may include a gate pad electrode 141, a capacitor pad electrode 143, and a contact pad electrode 165. Hereinafter, in order to explain a relationship with the display area (DA), without any particular mention, FIGS. 1 and 2 will also be referred to.

A buffer layer 110 may be disposed on the substrate 100, and a gate pad electrode 141 may be disposed on the buffer layer 110. The gate pad electrode 141 may include the same material as the gate electrode 140 in the display area (DA). The gate pad electrode 141 may be formed simultaneously with the gate electrode 140 by the same process. In some implementations, the gate pad electrode 141 and the gate electrode 140 may be formed separately by different processes. The gate insulating layer 131 may be disposed between the gate pad electrode 141 and the buffer layer 110.

The capacitor insulating layer 132 may be disposed on the gate pad electrode 141 and the buffer layer 110, and the capacitor pad electrode 143 may be disposed on the capacitor insulating layer 132. The capacitor pad electrode 143 may be in contact with the gate pad electrode 141 through a contact hole formed in the capacitor insulating layer 132 outside of the pad portion (PP). The capacitor pad electrode 143 may include the same material as the second capacitor electrode C2 disposed in the display area (DA). The capacitor pad electrode 143 may be formed by the same process as the second capacitor electrode C2. In some implementations, the capacitor pad electrode 143 may be formed separately from the second capacitor electrode C2 by another process.

The interlayer insulating layer 150 may be disposed on the capacitor pad electrode 143 and the capacitor insulating layer 132. The interlayer insulating layer 150 may include openings overlapping with the capacitor pad electrode 143. The contact pad electrode 165 may be disposed on the interlayer insulating layer 150 and the capacitor pad electrode 143. The contact pad electrode 165 may be in contact with the capacitor pad electrode 143 through the openings of the interlayer insulating layer 150. The contact pad electrode 165 may include the same material as the source electrode 161 and the drain electrode 162 disposed in the display area (DA). The contact pad electrode 165 may have a triple-layer structure in which a lower layer 165$p$ including titanium or molybdenum, an intermediate layer 165$q$ including aluminum, and an upper layer 165$r$ including titanium or molybdenum are sequentially stacked.

A method of manufacturing a display device according to an embodiment will now be described with reference to FIGS. 5 to 7, FIG. 2, and FIG. 4. In addition, in order to explain a relationship with the display area (DA) without any special mention, FIG. 1 is also referred to.

Figure 5:
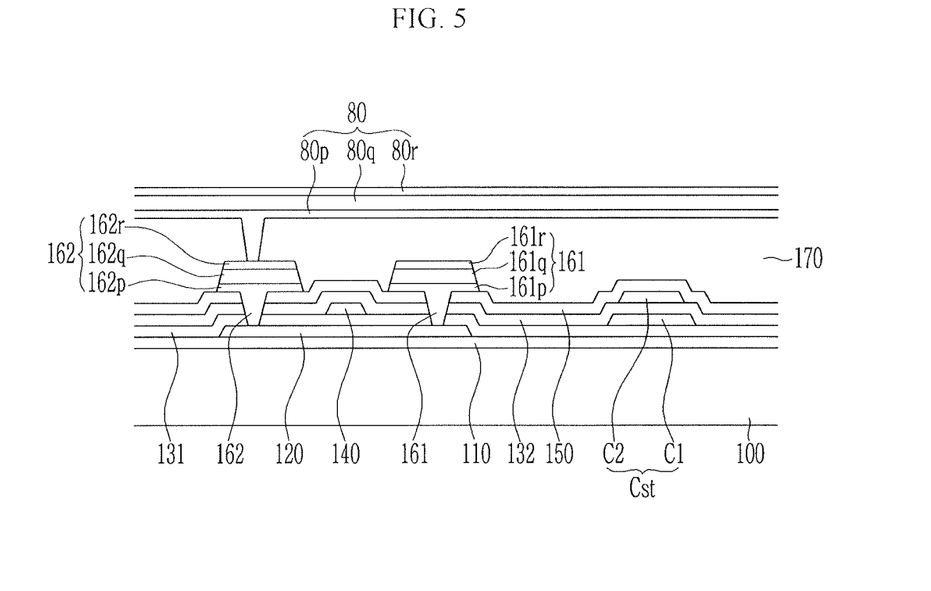
FIGS. 5 to 7 illustrate schematic views showing a method of manufacturing a display device according to an embodiment.
Figure 6:
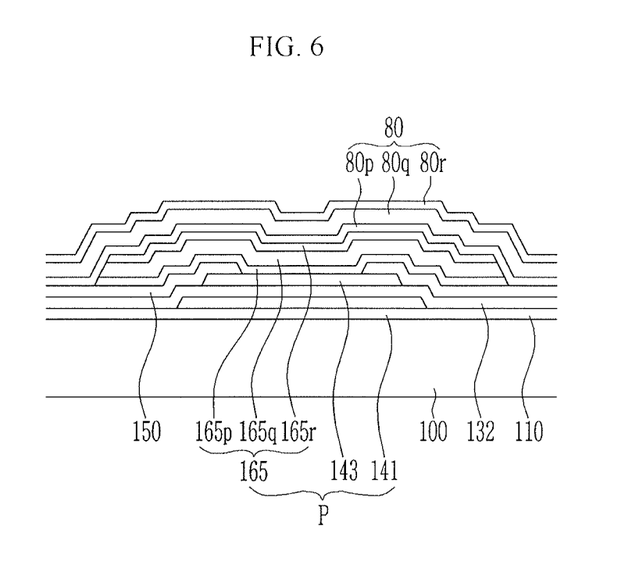
Figure 7:
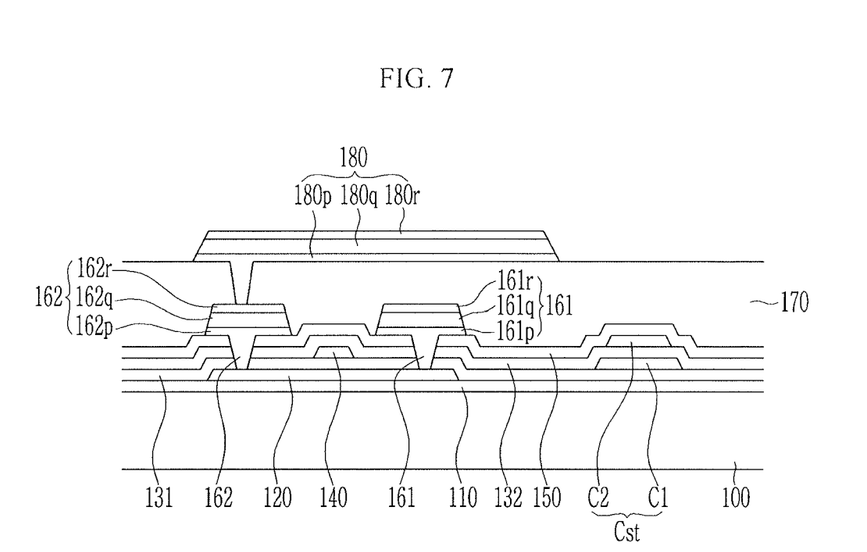

FIGS. 5 to 7 illustrate schematic views showing a method of manufacturing a display device according to an embodiment.

Referring to FIGS. 5 and 6, a buffer layer 110 may be formed on a substrate 100, a semiconductor layer 120 may be formed on the buffer layer 110, and a gate insulating layer 131 may be formed on the semiconductor layer 120.

A gate electrode 140 and a first capacitor electrode C1 spaced from each other may be formed on the gate insulating layer 131. A gate pad electrode 141 may be formed on the buffer layer 110. The gate electrode 140 may overlap the semiconductor layer 120. The gate electrode 140 and the first capacitor electrode C1 may be formed in the display region (DA). The gate pad electrode 141 may be formed in the pad portion (PP) of the non-display region (NA). The gate insulating layer 131 may be disposed between the gate pad electrode 141 and the buffer layer 110.

A capacitor insulating layer 132 may be formed on the gate insulating layer 131, the gate electrode 140, the first capacitor electrode C1, and the gate pad electrode 141. A second capacitor electrode C2 and a capacitor pad electrode 143 may be formed on the capacitor insulating layer 132. The second capacitor electrode C2 may overlap the first capacitor electrode C1, and the capacitor pad electrode 143 may overlap the gate pad electrode 141. The first capacitor electrode C1 and the second capacitor electrode C2 may form a storage capacitor Cst using the capacitor insulating layer 132 disposed between the second capacitor electrode C2 and the first capacitor electrode C1 as a dielectric.

After the interlayer insulating layer 150 is formed on the second capacitor electrode C2 and the capacitor insulating layer 132, a source electrode 161 and a drain electrode 162 which are spaced from each other, and a contact pad electrode 165, may be formed on the interlayer insulating layer 150. The source electrode 161 and the drain electrode 162 may be connected to the semiconductor layer 120 through contact holes disposed in the gate insulating layer 131, the capacitor insulating layer 132, and the interlayer insulating layer 150, respectively. The contact pad electrode 165 may contact the capacitor pad electrode 143 through the openings of the interlayer insulating layer 150. The source electrode 161, the drain electrode 162, and the contact pad electrode 165 may have triple-layer structures in which lower layers 161$p$, 162$p$, and 165$p$ including titanium or molybdenum, intermediate layers 161$q$, 162$q$, and 165$q$ including aluminum, and upper layers 161$r$, 162$r$, and 165$r$ including titanium or molybdenum are sequentially stacked. The contact pad electrode 165 may form the pad P together with the capacitor pad electrode 143 and the gate pad electrode 141.

A planarization layer 170 may be formed on the source electrode 161, the drain electrode 162, and the interlayer insulating layer 150. At this time, the planarization layer 170 may not be formed on the contact pad electrode 165.

A first electrode material layer 80 may be formed on the planarization layer 170 and the contact pad electrode 165. The first electrode material layer 80 may be electrically connected to the drain electrode 162 through a contact hole formed in the planarization layer 170. The first electrode material layer 80 may have a triple-layer structure in which a lower electrode material layer 80$p$, a middle electrode material layer 80$q$, and an upper electrode material layer 80$r$ are sequentially stacked. The lower electrode material layer 80$p$ and the upper electrode material layer 80$r$ may include a transparent conductive material, and the middle electrode material layer 80$q$ may include silver or a silver alloy.

The transparent conductive material may include one of indium-tin-oxide (ITO), indium-zinc-oxide (IZO), indium-tin-zinc-oxide (ITZO), and indium-gallium-zinc-oxide (IGZO). The silver alloy may include silver as a main component and may further include a metal such as neodymium (Nd), copper (Cu), palladium (Pd), niobium (Nb), nickel (Ni), molybdenum (Mo), chromium (Cr), magnesium (W), protactinium (Pa), titanium (Ti), or the like, an alloy including other metals, a nitride of silver, a silicide of silver, a carbide of silver, or an oxide of silver.

Referring to FIGS. 7 and 4, the first electrode material layer 80 may be etched to form a first electrode 180 that is electrically connected to the drain electrode 162 through a contact hole formed in the planarization layer 170. The first electrode material layer 80 may be etched using the etchant according to the embodiments. The lower electrode material layer 80p, the middle electrode material layer 80q, and the upper electrode material layer 80r may be batch-etched. Thereby, the first electrode 180 may have a triple-layer structure in which the lower electrode 180p, the middle electrode 180q, and the upper electrode 180r are sequentially stacked. The lower electrode 180p and the upper electrode 180r may include a transparent conductive material, and the middle electrode 180q may include silver or a silver alloy. The first electrode material layer 80 disposed on the contact pad electrode 165 may be removed. When the first electrode material layer 80 is etched using the etchant according to the embodiments, particles of the material forming the middle electrode material layer 80q, for example, silver particles, are not adsorbed on the contact pad electrode 165. Thus, it may be possible to prevent defects of the pad (P) that could be caused by adsorption of silver particles.

Referring to FIG. 2, the pixel defining layer 190 having an opening overlapping the first electrode 180 may be formed on the planarization layer 170, the light emitting member 181 may be formed on the first electrode 180 overlapping the opening of the pixel defining layer 190, and the second electrode 182 may be formed on the pixel defining layer 190 and the light emitting member 181. The first electrode 180, the light emitting member 181, and the second electrode 182 may form a light emitting diode (LD), wherein the first electrode 180 is an anode of the light emitting diode (LD) and the second electrode 182 is a cathode of the light emitting diode (LD). The second electrode 182 may include a transparent conductive material.

A capping layer 191 may be formed on the second electrode 182. An encapsulation layer 200 may be formed on the capping layer 191. The encapsulation layer 200 may include a first inorganic layer 201, an organic layer 202, and a second inorganic layer 203 which are sequentially stacked on the capping layer 191.

The characteristics of the etchant according to the embodiment will now be described with reference to FIG. 8.

Figure 8:
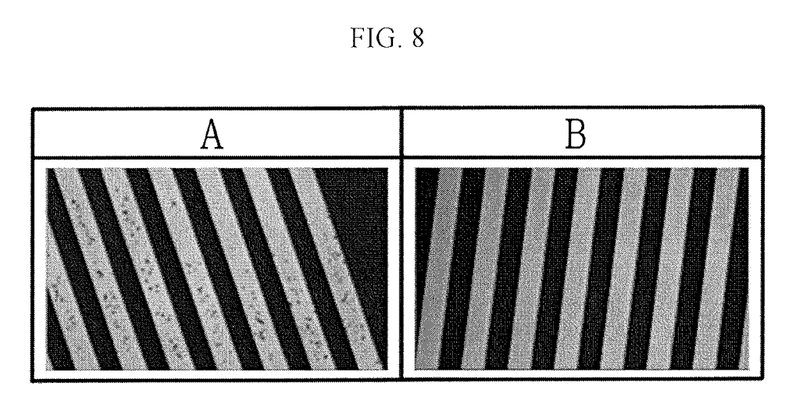
FIG. 8 illustrates an image showing the characteristics of etchants according to examples.

FIG. 8 illustrates an image showing the characteristics of etchants according to examples.

In FIG. 8, A illustrates a scanning electron microscope (SEM) image of a pad including a first electrode material layer etched using an etchant including phosphoric acid. B illustrates a scanning electron microscope (SEM) image of a pad including a first electrode material layer etched using an etchant not including phosphorous acid according to an example of the present disclosure.

Referring to FIG. 8, in A, a large amount of silver particles is shown to be adsorbed on the pad, while in B, it is shown that silver particles are not adsorbed on the pad.

Hereinafter, the performance of the etchant according to an embodiment will be described with reference to specific experimental examples.

Example 1

As shown in Table 1, an etchant including 9.5 wt % of nitric acid, 4.5 wt % of methane sulfonic acid, 15 wt % of acetic acid, 30 wt % of citric acid, 2.5 wt % of a citrate salt, 10 wt % of potassium bisulfate, and a balance of water was prepared.

Example 2

As shown in Table 1, an etchant including 9.5 wt % of nitric acid, 4.5 wt % of methane sulfonic acid, 15 wt % of acetic acid, 30 wt % of citric acid, 2 wt % of a citrate salt, 10 wt % of sodium bisulfate, and a balance of water was prepared.

Example 3

As shown in Table 1, an etchant including 9.5 wt % of nitric acid, 4.5 wt % of methane sulfonic acid, 15 wt % of acetic acid, 30 wt % of citric acid, 2 wt % of a citrate salt, 12 wt % of magnesium sulfate, and a balance of water was prepared.

Example 4

As shown in Table 1, an etchant including 9.5 wt % of nitric acid, 4.5 wt % of methane sulfonic acid, 15 wt % of acetic acid, 30 wt % of citric acid, 2 wt % of an acetate salt, 10 wt % of sodium bisulfate, and a balance of water was prepared.

Comparative Example 1

As shown in Table 1, an etchant including 9.5 wt % of nitric acid, 4.5 wt % of methane sulfonic acid, 15 wt % of acetic acid, 30 wt % of citric acid, 2 wt % of a citrate salt, 6 wt % of magnesium sulfate, and a balance of water was prepared.

Comparative Example 2

As shown in Table 1, an etchant including 9.5 wt % of nitric acid, 4.5 wt % of methane sulfonic acid, 15 wt % of acetic acid, 30 wt % of citric acid, 2 wt % of a citrate salt, 14 wt % of sodium bisulfate, and a balance of water was prepared.

Comparative Example 3

As shown in Table 1, an etchant including 9.5 wt % of nitric acid, 4.5 wt % of methane sulfonic acid, 15 wt % of acetic acid, 30 wt % of citric acid, 3 wt % of a citrate salt, 9 wt % of potassium bisulfate, and a balance of water was prepared.

Comparative Example 4

As shown in Table 1, an etchant including 9.5 wt % of nitric acid, 4.5 wt % of methane sulfonic acid, 15 wt % of acetic acid, 30 wt % of citric acid, 1.5 wt % of a citrate salt, 10.5 wt % of potassium bisulfate, and a balance of water was prepared.

Comparative Example 5

As shown in Table 1, an etchant including 9.5 wt % of nitric acid, 4.5 wt % of methane sulfonic acid, 15 wt % of acetic acid, 30 wt % of citric acid, 1 wt % of a citrate salt, 5 wt % of sodium bisulfate, and a balance of water was prepared.

The etchants of Examples 1 to 4 and the etchants of Comparative Examples 1 to 5 were prepared in the same weight.

TABLE 1

| Unit (wt %) | Nitric acid | Alkylsulfonic acid Methane sulfonic acid | Organic acid | | Organic acid salt | | Sulfate salt | | | Water | Organic acid salt:sulfate salt |
|---|---|---|---|---|---|---|---|---|---|---|---|
| | | | Acetic acid | Citric acid | Acetate salt | Citrate salt | Potassium bisulfate | Sodium bisulfate | Magnesium sulfate | | |
| Ex. 1 | 9.5 | 4.5 | 15 | 30 | — | 2.5 | 10 | — | — | balance | 1:04 |
| Ex. 2 | 9.5 | 4.5 | 15 | 30 | — | 2 | — | 10 | — | balance | 1:05 |
| Ex. 3 | 9.5 | 4.5 | 15 | 30 | — | 2 | — | — | 12 | balance | 1:06 |
| Ex. 4 | 9.5 | 4.5 | 15 | 30 | 2 | — | 10 | — | — | balance | 1:05 |
| Comp. Ex. 1 | 9.5 | 4.5 | 15 | 30 | — | 2 | — | — | 6 | balance | 1:03 |
| Comp. Ex. 2 | 9.5 | 4.5 | 15 | 30 | — | 2 | — | 14 | — | balance | 1:07 |
| Comp. Ex. 3 | 9.5 | 4.5 | 15 | 30 | — | 3 | 9 | — | — | balance | 1:03 |
| Comp. Ex. 4 | 9.5 | 4.5 | 15 | 30 | — | 1.5 | 10.5 | — | — | balance | 1:07 |
| Comp. Ex. 5 | 9.5 | 4.5 | 15 | 30 | — | 1 | — | 5 | — | balance | 1:05 |

Each specimen according to Experimental Examples 1 to 3 was prepared by forming a pad including a lower Ti layer, an Al layer, and an upper Ti layer on a substrate, sequentially stacking a lower ITO layer, a Ag layer, and an upper ITO layer on the pad to form a triple metal layer and forming a photoresist pattern on the upper ITO layer.

Experimental Example 1—Evaluation of Side Etch

In the specimen, the triple metal layer exposed by the photoresist pattern was etched. Herein, with reference to time when the triple metal layer was finished with etching, additional etching of 50% (O/E 50%) and additional etching of 100% (O/E 100%) were performed, and then a distance (side etch) from the end of the photoresist pattern to the etched Ag layer was measured by using a scanning electronic microscope (SEM), and the results are shown in Table 2. The additional etching of 50% (O/E 50%) was performed for 50% of the entire etching time of the triple metal layer, and the additional etching of 100% (O/E 100%) was performed for 100% of the entire etching time of the triple metal layer. It is desirable that the side etch be in a range of 0.15 to 0.25 um. In Table 2, the term "new etchant" indicates a state directly after preparing an etchant, and the term "conventional etchant" indicates a state that 1000 ppm of Ag powder was completely dissolved in the etchant under an assumption of performing an etching process for a long time.

Referring to Table 2, the etchants according to Examples 1 to 4 showed side etch in a range of 0.15 to 0.25 um, when the additional etching of 50% (O/E 50%) and the additional etching of 100% (O/E 100%) were performed by using the new etchant and the conventional etchant. Accordingly, the etchants according to Examples 1 to 4 were shown to have a side etch within the desirable range.

The etchants according to Comparative Examples 1, 2, and 5 had side etch out of the range of 0.15 to 0.25 um, when the additional etching of 50% (O/E 50%) and the additional etching of 100% (O/E 100%) were performed by using the new etchant and the conventional etchant. Accordingly, the etchants according to Comparative Examples 1, 2, and 5 were shown to have a side etch out of the desirable range.

The etchant of Comparative Example 3 had side etch out of the range of 0.15 to 0.25 um when the additional etching 100% was performed by using the new etchant and the conventional etchant (O/E 100%). Accordingly, when the etchant of Comparative Example 3 was used to perform the additional etching of 100% (O/E 100%), side etch was shown to be out of the desirable range.

As for the etchant of Comparative Example 4, when the conventional etchant was used to perform additional etching of 100% (O/E 100%), side etch was shown to be out of the range of 0.15 to 0.25 um. Accordingly, as with the etchant of Comparative Example 3, side etch using the conventional etchant was shown to be out of the desirable range.

Experimental Example 2—Ag Residue and ITO Residue Evaluation

The etchants according to Examples 1 to 4 and Comparative Examples 1 to 4 were respectively put into spray-etching equipment, and then heated up to 40° C. Subsequently, when the temperature reached 40±0.1° C., the triple metal layer exposed by the photoresist pattern in the specimen was etched. The etching was performed for 85 seconds in total. The specimen was put into the equipment, sprayed, taken out when the etching time of 85 seconds was done, washed with deionized water, and dried by using a hot air drier. Then, the photoresist pattern was removed therefrom by using a photoresist stripper (PR stripper). After the washing and drying, Ag and ITO residues not etched but remaining where the photoresist was not covered were measured by using a scanning electronic microscope (SEM) and evaluated according to the following reference, and the results are shown in Table 2.

Residue Evaluation Criteria

Good: Ag and ITO residues are not formed
Inferior: Ag or ITO residues are formed
Referring to Table 2, the etchants of Examples 1 to 4 showed good Ag and ITO residue evaluation results.

The etchants of Comparative Examples 1 and 5 showed inferior Ag and ITO residue evaluation results. The etchants of Comparative Examples 2 to 4 showed good Ag and ITO residue evaluation results.

Experimental Example 3—Ag Readsorption Evaluation

The etchants according to Examples 1 to 4 and Comparative Examples 1 to 5 were respectively put into spray etching-type equipment, and then heated up to 40° C. Subsequently, when the temperature reached 40±0.1° C., the triple metal layer exposed by the photoresist pattern in the specimen was etched. The etching was performed for 85 seconds in total. In particular, the specimen was put into the equipment, sprayed, taken out when the etching time of 85 seconds was done, washed with deionized water, and dried by using a hot air drier, and then the photoresist pattern was removed therefrom by using a photoresist stripper (PR stripper). After the washing and drying, the number of Ag particles adsorbed in the lower Ti layer, the Al layer, and the upper Ti layer of the exposed pad through the etching was measured by using a scanning electronic microscope (SEM) and evaluated according to the following reference, and the results are shown in Table 2.

Ag Readsorption Evaluation Criteria

Good: Less than 5

Moderate: greater than or equal to 5 and less than 50

Inferior: greater than or equal to 50

Referring to Table 2, the etchants of Examples 1 to 4 showed a good Ag readsorption result in the new etchant and a moderate Ag readsorption result in the conventional etchant.

The etchants according to Comparative Examples 1 and 5 showed an inferior Ag readsorption result. The etchants according to Comparative Examples 2 to 4 showed a good Ag readsorption result in the new etchant and a moderate Ag readsorption result in the conventional etchant.

electrode layer on the entire surface. With such a general etchant, silver particles may be adsorbed on a pad portion and thus may cause defects of the pad portion.

Embodiments provide and etchant that enables batch etching of multi-layered metal layers composed of a metal layer including a transparent conductive material and a metal layer including silver or a silver alloy.

Embodiments also provide a method of manufacturing a display device using the etchant Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

TABLE 2

|  | New etchant | | | | Conventional etchant | | | |
| --- | --- | --- | --- | --- | --- | --- | --- | --- |
|  | Side etch (um) | | Ag residues and | | Side etch (um) | | Ag residues and | |
|  | O/E 50% | O/E 100% | ITO residues | Ag readsorption | O/E 50% | O/E 100% | ITO residues | Ag readsorption |
| Ex. 1 | 0.20 | 0.19 | good | good | 0.19 | 0.21 | good | moderate |
| Ex. 2 | 0.19 | 0.18 | good | good | 0.20 | 0.18 | good | moderate |
| Ex. 3 | 0.18 | 0.19 | good | good | 0.19 | 0.19 | good | moderate |
| Ex. 4 | 0.22 | 0.24 | good | good | 0.22 | 0.25 | good | moderate |
| Comp. Ex. 1 | 0.02 | 0.05 | inferior | inferior | 0.02 | 0.03 | inferior | inferior |
| Comp. Ex. 2 | 0.34 | 0.68 | good | good | 0.40 | 0.81 | good | moderate |
| Comp. Ex. 3 | 0.19 | 0.29 | good | good | 0.20 | 0.30 | good | moderate |
| Comp. Ex. 4 | 0.18 | 0.19 | good | good | 0.31 | 0.30 | good | moderate |
| Comp. Ex. 5 | 0.02 | 0.05 | inferior | inferior | 0.03 | 0.03 | inferior | inferior |

<Ratio of Sulfate Relative to Organic Acid Salt>

Referring to Table 2, in the case of the etchants of Examples 1 to 4, when the ratios of sulfate relative to organic acid salt in the compositions of the etchants were 4 to 6, good side etch values, ITO residues, and good/moderate Ag readsorption performance may be exhibited in the new etchants and the conventional etchants.

On the other hand, when a ratio of the sulfate relative to the organic acid salt was out of the range of 4 to 6, as with the etchants according to Comparative Examples 1 to 5, etching performance was deteriorated, thus side etch was small, or Ag and ITO residues were generated, or, since an etch-rate were not controlled, the side etch became large.

By way of summation and review, an anode may have a triple-layer structure of a transparent electrode layer, a silver layer, and a transparent electrode layer. Such an anode may generally be formed by dry etching using a general etchant with phosphoric acid as a main component after depositing a transparent electrode layer, a silver layer, and a transparent

What is claimed is:

1. An etchant, including:
   about 8 wt % to about 12 wt % of nitric acid;
   about 3 wt % to about 8 wt % of alkylsulfonic acid;
   about 7 wt % to about 12 wt % of a sulfate;
   about 40 wt % to about 55 wt % of an organic acid;
   about 0.5 wt % to about 5 wt % of an organic acid salt; and
   a balance of water.

2. The etchant as claimed in claim 1, wherein a ratio of the sulfate relative to the organic acid salt by weight is about 4 to about 6.

3. The etchant as claimed in claim 2, wherein the alkylsulfonic acid includes at least one of methane sulfonic acid, ethane sulfonic acid, and propane sulfonic acid.

4. The etchant as claimed in claim 3, wherein the alkylsulfonic acid is methane sulfonic acid.

5. The etchant as claimed in claim 4, wherein the organic acid includes at least one of acetic acid, citric acid, glycolic acid, malonic acid, lactic acid, and tartaric acid.

6. The etchant as claimed in claim 5, wherein the organic acid includes the acetic acid and the citric acid.

7. The etchant as claimed in claim 6, wherein the organic acid salt includes at least one of an acetate salt, a citrate salt, a glycolate salt, a malonate salt, a lactate salt, and a tartrate salt.

8. The etchant as claimed in claim 7, wherein the organic acid salt includes the acetate salt or the citrate salt.

9. The etchant as claimed in claim 8, wherein the sulfate includes at least one of potassium bisulfate, sodium bisulfate, and magnesium sulfate.

10. A method of manufacturing a display device, the method including:
    forming a transistor and a pad on a substrate;
    forming a planarization layer on the transistor;
    forming a first electrode material layer on the planarization layer and the pad;
    etching the first electrode material layer using an etchant to form a first electrode connected to the transistor;
    forming a pixel defining layer having an opening overlapping with the first electrode on the first electrode;
    forming a light emitting member on the first electrode in the opening; and
    forming a second electrode on the light emitting member,
    wherein the etchant includes:
    about 8 wt % to about 12 wt % of nitric acid,
    about 3 wt % to about 8 wt % of alkylsulfonic acid,
    about 7 wt % to about 12 wt % of a sulfate,
    about 40 wt % to about 55 wt % of an organic acid,
    about 0.5 wt % to about 5 wt % of an organic acid salt, and
    a balance of water.

11. The method as claimed in claim 10, wherein the first electrode material layer includes:
    a lower electrode material layer including a transparent conductive material;
    a middle electrode material layer on the lower electrode material layer, the middle electrode material layer including silver or a silver alloy material; and
    an upper electrode material layer on the middle electrode material layer, the upper electrode material layer including the transparent conductive material.

12. The method as claimed in claim 11, wherein in forming the first electrode,
    the etchant batch-etches the lower electrode material layer, the middle electrode material layer, and the upper electrode material layer.

13. The method as claimed in claim 12, wherein a ratio of the sulfate relative to the organic acid salt by weight is about 4 to about 6.

14. The method as claimed in claim 13, wherein the alkylsulfonic acid includes at least one of methane sulfonic acid, ethane sulfonic acid, and propane sulfonic acid.

15. The method as claimed in claim 14, wherein the alkylsulfonic acid is the methane sulfonic acid.

16. The method as claimed in claim 15, wherein the organic acid includes at least one of acetic acid, citric acid, glycolic acid, malonic acid, lactic acid, and tartaric acid.

17. The method as claimed in claim 16, wherein the organic acid includes the acetic acid and the citric acid.

18. The method as claimed in claim 17, wherein the organic acid salt includes at least one of an acetate salt, a citrate salt, a glycolate salt, a malonate salt, a lactate salt, and a tartrate salt.

19. The method as claimed in claim 18, wherein the organic acid salt includes the acetate salt or the citrate salt.

20. The method as claimed in claim 19, wherein the sulfate includes at least one of potassium bisulfate, sodium bisulfate, and magnesium sulfate.

\* \* \* \* \*